US012751001B2

(12) United States Patent
Tang et al.

(10) Patent No.: US 12,751,001 B2
(45) Date of Patent: Sep. 29, 2026

(54) SEMICONDUCTOR DEVICE, MEMORY SYSTEM AND FABRICATION METHOD OF A SEMICONDUCTOR DEVICE

(71) Applicant: YANGTZE MEMORY TECHNOLOGIES CO., LTD., Wuhan (CN)

(72) Inventors: Zhaoyun Tang, Wuhan (CN); Zhi Zhang, Wuhan (CN); Zhongwei Luo, Wuhan (CN); Wenyu Hua, Wuhan (CN); He Chen, Wuhan (CN); Xing Zhang, Wuhan (CN); Yugang Wu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 370 days.

(21) Appl. No.: 18/360,496

(22) Filed: Jul. 27, 2023

(65) Prior Publication Data

US 2024/0349489 A1 Oct. 17, 2024

(30) Foreign Application Priority Data

Apr. 14, 2023 (CN) ......................... 202310412896.3

(51) Int. Cl.
*H10B 12/00* (2023.01)

(52) U.S. Cl.
CPC ........... *H10B 12/482* (2023.02); *H10B 12/02* (2023.02); *H10B 12/315* (2023.02)

(58) Field of Classification Search
CPC ............................ H10B 12/315; H10B 12/482
See application file for complete search history.

(56) References Cited

U.S. PATENT DOCUMENTS

2015/0014759 A1* 1/2015 Lee ...................... H10B 12/053 257/306
2015/0214146 A1* 7/2015 Kim ..................... H10B 12/482 257/773
2020/0111512 A1* 4/2020 Kim ......................... G11C 7/18
2021/0035613 A1* 2/2021 Park ........................ H10B 12/34
2021/0134809 A1* 5/2021 Son ................... H01L 21/02164
2022/0336465 A1* 10/2022 Kim ..................... H10B 12/315
2024/0008263 A1* 1/2024 Lu ........................ H10B 12/482

* cited by examiner

*Primary Examiner* — Steven M Page
(74) *Attorney, Agent, or Firm* — Conley Rose, P.C.

(57) ABSTRACT

Examples of the present application provide a semiconductor device, a memory system and a fabrication method of a semiconductor device. The semiconductor device includes: a silicon contact structure; a metal silicide layer on one side of the silicon contact structure; a bit line structure located on the side of the metal silicide layer away from the silicon contact structure and extending in a first direction; and a sidewall structure covering the opposite sides of the bit line structure and the opposite sides of the metal silicide layer in the first direction and extending further to cover the opposite sides, in the first direction, of the first end of the silicon contact structure proximate to the metal silicide layer.

18 Claims, 14 Drawing Sheets

SEMICONDUCTOR DEVICE, MEMORY SYSTEM AND FABRICATION METHOD OF A SEMICONDUCTOR DEVICE

CROSS-REFERENCE TO RELATED APPLICATIONS

The present application claims priority to Chinese Patent Application No. 2023104128963, which was filed Apr. 14, 2023, is titled "SEMICONDUCTOR DEVICE, MEMORY SYSTEM AND FABRICATION METHOD OF A SEMICONDUCTOR DEVICE," and is hereby incorporated herein by reference in its entirety.

TECHNICAL FIELD

The present application is related to the field of semiconductor technologies, and more particularly to a semiconductor device, a memory system and a fabrication method of a semiconductor device.

BACKGROUND

One of the storage components in an electronic system is a dynamic random-access memory (DRAM). In a DRAM, one memory cell usually composed of a capacitor and a transistor and memory cells are arranged in a two-dimensional (2D) array. The plurality of transistors arranged in a first direction of the 2D array may be connected to the same bit line structure. However, the bit line structure may collapse during formation of the bit line structure and structures associated therewith, lowering the product yield.

SUMMARY

The present application provides a method of fabricating a semiconductor device, a semiconductor device and a memory system to at least partially solve the above-described challenges in related arts or other challenges in the present field.

Some examples of the present application provide a semiconductor device. The semiconductor device includes: a silicon contact structure; a metal silicide layer on one side of the silicon contact structure; a bit line structure located on the side of the metal silicide layer away from the silicon contact structure and extending in a first direction; and a sidewall structure covering the opposite sides of the bit line structure and the opposite sides of the metal silicide layer in the first direction and extending further to cover the opposite sides, in the first direction, of the first end of the silicon contact structure proximate to the metal silicide layer.

In some examples, the sidewall structure extends continuously in the first direction.

In some examples, the sidewall structure is in contact with the opposite sides of the metal silicide layer in the first direction and with the opposite sides of the first end in the first direction.

In some examples, the semiconductor device further includes an oxide layer between the metal silicide layer and the silicon contact structure, and the sidewall structure also covers the opposite sides of the oxide layer in the first direction.

In some examples, the semiconductor device further includes an insulating layer on the opposite sides of the sidewall structure and the opposite sides of the silicon contact structure in the first direction.

In some examples, the portion of the insulating layer corresponding to the bit line structure has air gaps therein.

In some examples, the material of the sidewall structure has a different etching selection ratio from the material of the portion of the insulating layer corresponding to the silicon contact structure.

In some examples, the material of the sidewall structure includes titanium nitride.

In some examples, the bit line structure includes a metal material layer and a blocking layer with the blocking layer covering the metal material layer on opposite sides in the first direction and located between the metal material layer and the metal silicide layer.

In some examples, the sidewall structure and the blocking layer have the same material and are an integral structure.

In some examples, the material of the metal material layer includes at least one of tungsten, aluminum and copper, and the material of the blocking layer includes at least one of titanium, titanium nitride, tantalum and tantalum nitride.

In some examples, the material of the metal silicide layer includes at least one of titanium silicide, cobalt silicide, nickel silicide and platinum silicide.

In some examples, the silicon contact structure includes a polysilicon layer and a single crystal silicon layer with the polysilicon layer located between the single crystal silicon layer and the metal silicide layer.

Some other examples of the present application provide a memory system that includes at least one semiconductor device mentioned in any of the examples above and a controller coupled with and used to control the semiconductor device.

Some other examples of the present application provide a method of fabricating a semiconductor device, the method including: providing a semiconductor structure including a first insulating layer and a silicon contact structure in the first insulating layer, wherein the silicon contact structure is recessed from the surface of the first insulating layer to form a first trench extending in a first direction; etching the first insulating layer to expose the opposite sidewalls of the first end of the silicon contact structure in the first direction through the first trench; forming a sidewall structure over the sidewalls of the first trench, wherein the sidewall structure covers the opposite sidewalls of the first end in the first direction; and forming a metal silicide layer on a top side of the silicon contact structure and a bit line structure in a space enclosed by the sidewall structure and the metal silicide layer.

In some examples, etching the first insulating layer to expose the opposite sidewalls of the first end of the silicon contact structure in the first direction through the first trench includes: setting the distance between a bottom surface of the first trench and a top surface of the silicon contact structure exposed in the first trench to be 5 to 30 nm.

In some examples, the material of the sidewall structure has a different etching selection ratio from the material of the first insulating layer.

In some examples, forming the metal silicide layer on the top side of the silicon contact structure and the bit line structure in the space enclosed by the sidewall structure and the metal silicide layer includes: forming a metal layer on the top surface of the silicon contact structure; forming a blocking layer over the surfaces of the sidewall structure and the metal layer; reacting the metal layer and the silicon contact structure by an annealing process to generate the metal silicide layer; and filling a metal material inside the blocking layer to form the bit line structure.

In some examples, the material of the metal layer includes at least one of titanium, cobalt, nickel and platinum.

In some examples, the fabrication method further includes removing the portion of the first insulating layer corresponding to the bit line structure to form a first recess; and forming, in the first recess, a second insulating layer having air gaps therein.

In accordance with at least one example, the present application provides a semiconductor device, a memory system and a method of fabricating a semiconductor device, wherein the opposite sidewalls of the first end of the silicon contact structure in the first direction are exposed through the first trench by etching the first insulating layer, a sidewall structure is formed over the sidewalls of the first trench, and a metal silicide layer and a bit line structure are formed on the top side of the silicon contact structure, so that the sidewall structure covers the opposite sides of the bit line structure and the opposite sides of metal silicide layer in the first direction and extends further to cover the opposite sides, in the first direction, of the first end of the silicon contact structure proximate to the metal silicide layer. Therefore, in the step of removing the portion of the first insulating layer corresponding to the bit line structure, the sidewall structure will block the etchant from entering between the metal silicide layer and the silicon contact structure and avoid the corrosion of oxides that may exist between the metal silicide layer and the silicon contact structure, so that challenges of collapse of the bit line structure will be reduced, product integrity can be increased and product yield can be improved.

BRIEF DESCRIPTION OF THE DRAWINGS

Through reading the detailed description of non-limiting examples made with reference to the following figures, other features, purposes and advantages of the present application will become more apparent.

DETAILED DESCRIPTION

Figure 1A:
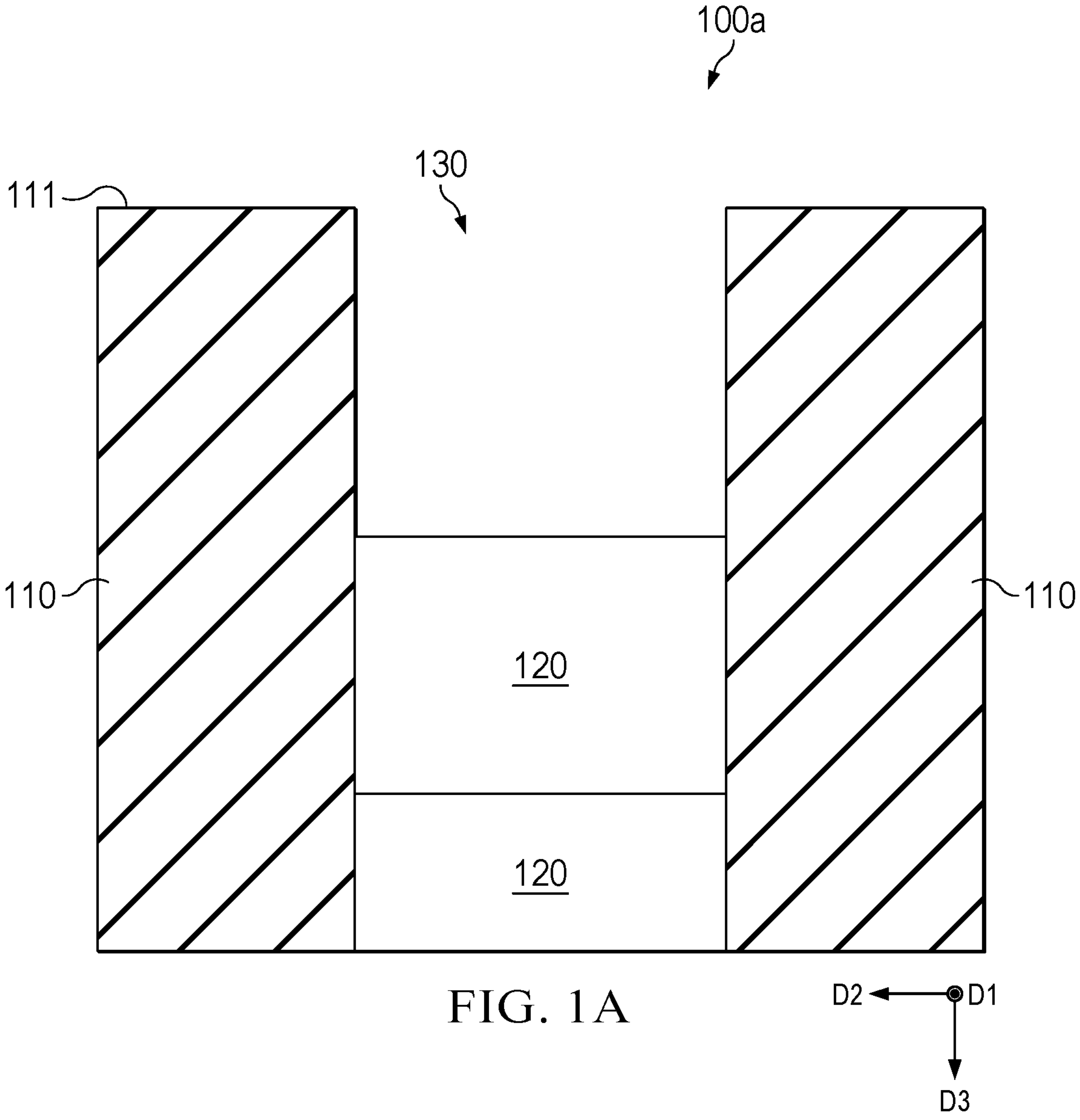
FIGS. 1A to 1C are schematic diagrams of intermediate structures of a semiconductor device during fabrication in accordance with an example of the present application.

For better understanding of the present application, various aspects of the present application will be described in more detail with reference to accompanying drawings. These detailed descriptions are only for the purpose of explaining examples of the present application and will in no way limit the scope of the present application. Throughout the specification, identical reference numerals refer to identical elements. The expression "and/or" includes any and all combinations of one or more of the associated listed items.

Throughout this specification, expressions such as "first," "second," "third" and the like are only used to distinguish one feature from another, and mean no limitation for any feature especially in any order. Therefore, a "first direction" discussed in the present application may also be referred to as a "second direction" and vice versa, without departing from teachings of the present application.

In the figures, thicknesses, dimensions and shapes of components have been somewhat adjusted for easy illustration. The figures are only examples and not strictly drawn to scale. As used herein, terms "approximate," "about" and the like indicate approximation instead of degrees and are intended to mean inherent variations in measurement values or calculated values, which can be appreciated by those of ordinary skills in the art.

Expressions such as "include," "comprise," "have" and/or "contain" are open rather than closed expressions in this specification, which indicate existence of the stated feature, element and/or component, but will not exclude existence of one or more other features, elements, components and/or any combinations thereof. Furthermore, when the expression such as "at least one of" precedes a list of the listed features, it modifies all the listed features instead of any individual ones of the list. Furthermore, when describing an example of the present application, the term "may" is used to indicate "one or more examples of the present application." Also, the term "exemplary" is intended to refer to an example or illustration.

All the terms (including engineering terms and scientific and technical terms) used herein have the same meanings as those commonly understood by those of ordinary skills in the art, unless otherwise specified. The terms defined in common dictionaries should be interpreted to have the meanings consistent with their contexts in pertinent arts and should not be interpreted too ideally or formally, unless otherwise specified explicitly in the application.

Examples of the application and features thereof may be combined where there are no conflicts. Furthermore, specific steps contained in a method described in the application may not necessarily be performed in the described order and instead may be performed in any other order or in parallel, unless there is an explicit definition or any conflict with the context.

Moreover, as used in the application, the term "connect" or "couple" may indicate direct or indirect contact between respective components, unless it is otherwise defined explicitly or can be derived from the context.

The application will be described in detail hereafter in connection with examples with reference to accompanying drawings.

Figure 1B:
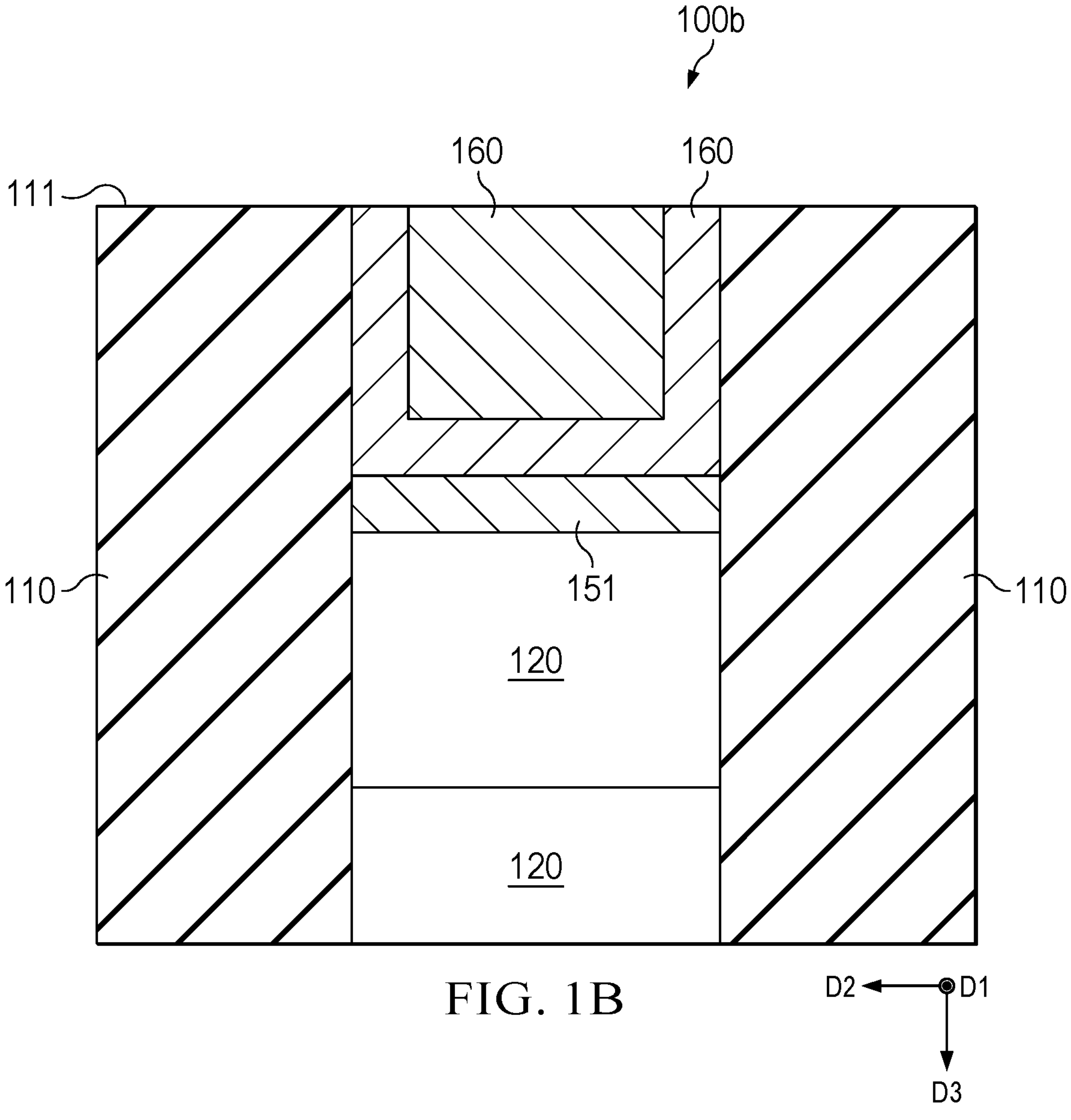
Figure 1C:
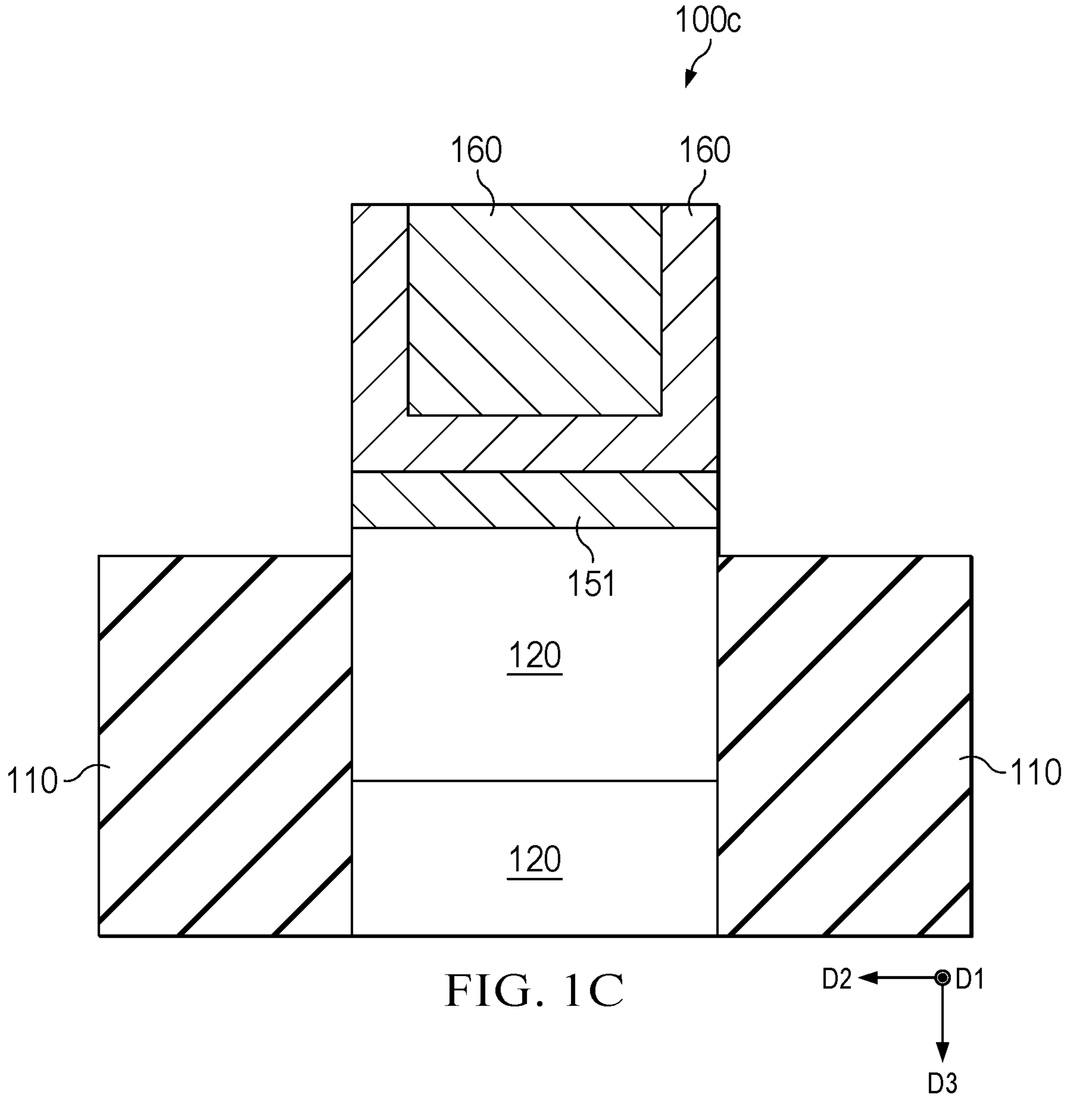

FIGS. 1A to 1C are schematic diagrams of intermediate structures of a semiconductor device during fabrication in accordance with an example of the present application. For example, FIGS. 1A to 1C may be used to illustrate formation of a bit line structure and structures associated therewith in a DRAM.

As shown in FIG. 1A, a fabrication method starts with providing a semiconductor structure 100*a*. The semiconductor structure 100*a* may be an intermediate structure of a semiconductor device. The semiconductor structure 100*a* includes a first insulating layer 110 and a silicon contact structure 120 in the first insulating layer 110. The silicon contact structure 120 is recessed from the surface 111 of the first insulating layer 110, so that a first trench 130 extending in the first direction D1 is formed. Subsequently, as shown in FIG. 1B, a metal silicide layer 151 and a bit line structure 160 are formed on the top side of the silicon contact structure 120. Then, as shown in FIG. 1C, a portion of the first insulating layer 110 corresponding to the bit line structure 160 and the metal silicide layer 151 are removed.

During fabrication of the semiconductor device in this example, oxides (e.g., titanium oxide) may be present between the metal silicide layer 151 and the silicon contact structure 120 due to process and in the step of removing the portion of the first insulating layer 110, the etchant (e.g., acid solution) may enter between the metal silicide layer 151 and the silicon contact structure 120 to corrode the interface between the metal silicide layer 151 and the silicon contact structure 120, leading to collapse of the bit line structure 160 thereabove.

Figure 2:
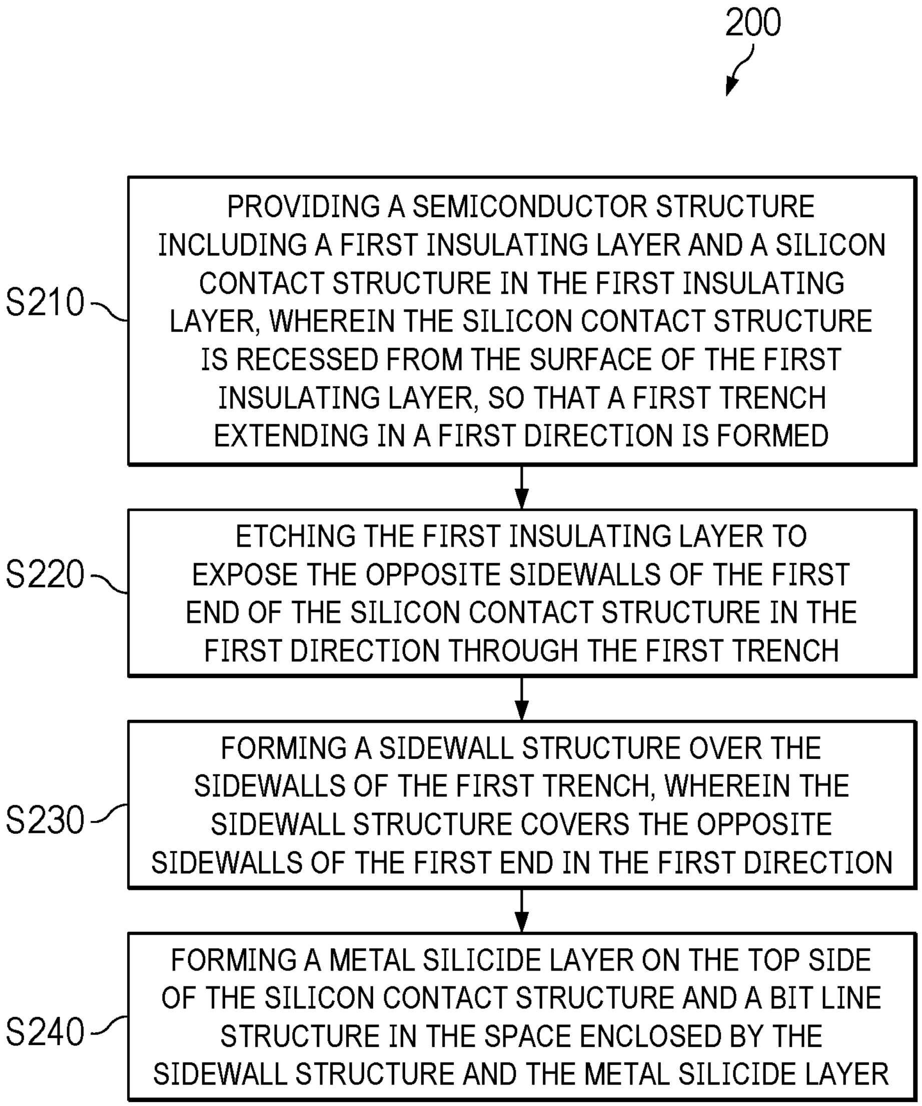
FIG. 2 is a flow chart of a method of fabricating a semiconductor device in accordance with another example of the present application.

In light of this, some examples of the present application provide another fabrication method of a semiconductor device. FIG. 2 is a flow chart of a method 200 of fabricating a semiconductor device in accordance with another example of the present application. As shown in FIG. 2, the method 200 of fabricating a semiconductor device (referred to as "fabrication method 200" hereafter) includes steps S210 to S240.

At step S210, a semiconductor structure including a first insulating layer and a silicon contact structure in the first insulating layer is provided, wherein the silicon contact structure is recessed from the surface of the first insulating layer, so that a first trench extending in a first direction is formed.

At step S220, the first insulating layer is etched to expose, through the first trench, the opposite sidewalls of the first end of the silicon contact structure in the first direction.

At step S230, a sidewall structure is formed over the sidewalls of the first trench, wherein the sidewall structure covers the opposite sidewalls of the first end in the first direction.

At step S240, a metal silicide layer is formed on the top side of the silicon contact structure and a bit line structure is formed in the space enclosed by the sidewall structure and the metal silicide layer.

In the method of fabricating a semiconductor device provided by this example, by etching the first insulating layer, the opposite sidewalls of the first end of the silicon contact structure in the first direction are exposed through the first trench. A sidewall structure is formed over the sidewalls of the first trench, and a metal silicide layer and a bit line structure are formed on the top side of the silicon contact structure, so that the sidewall structure covers the opposite sides of the bit line structure and the opposite sides of the metal silicide layer in the first direction and extends further to cover the opposite sides, in the first direction, of the first end of the silicon contact structure proximate to the metal silicide layer. Therefore, in the step of removing the portion of the first insulating layer corresponding to the bit line structure, the sidewall structure will block the etchant from entering between the metal silicide layer and the silicon contact structure and avoid the corrosion of oxides that may exist between the metal silicide layer and the silicon contact structure, so that challenges of collapse of the bit line structure may be improved, product integrity can be increased and product yield can be improved.

FIGS. 3A to 3H are schematic diagrams of intermediate structures of a semiconductor device during fabrication in accordance with another example of the present application. FIG. 3I is a schematic diagram of a semiconductor device in an example of the present application. For example, the intermediate structures of a semiconductor device as shown in FIGS. 3A to 3H and the semiconductor device as shown in FIG. 3I may be formed in accordance with the fabrication method 200 as shown in FIG. 2. The steps S210 to S240 are described hereafter in connection with FIGS. 3A to 3I.

At step S210, a semiconductor structure is provided.

Figure 3A:
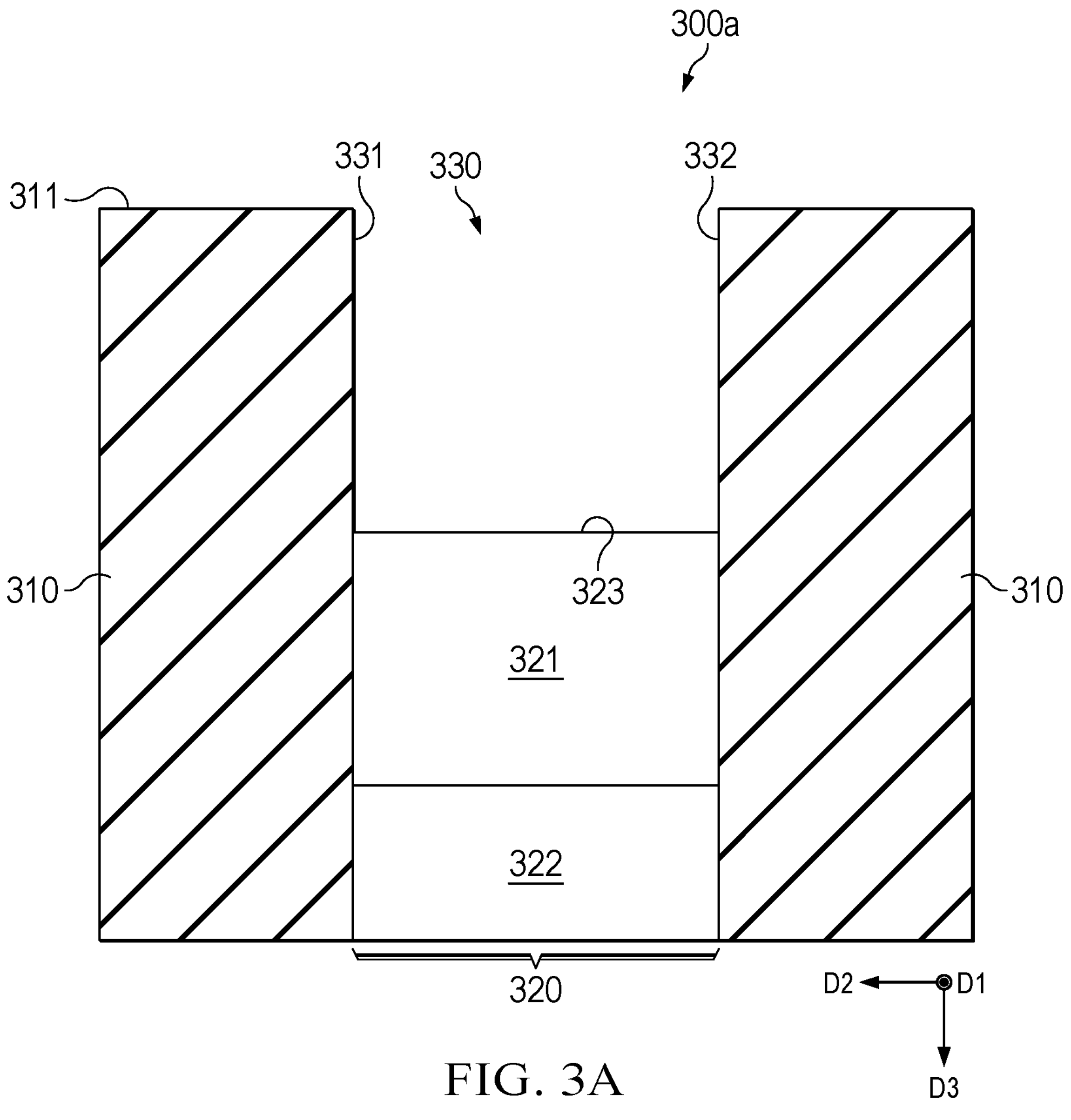
FIGS. 3A to 3H are schematic diagrams of intermediate structures of a semiconductor device during fabrication in accordance with another example of the present application.

FIG. 3A shows a semiconductor structure **300*a* provided at step S210. The semiconductor structure 300*a* may be an intermediate structure of a semiconductor device. As shown in FIG. 3A, the semiconductor structure 300*a* includes a first insulating layer 310 and a silicon contact structure 320. The silicon contact structure 320 is in the first insulating layer 310 and recessed from the surface 311 of the first insulating layer 310, so that a first trench 330 extending in the first direction D1 is formed. For example, the first insulating layer 310 is on the opposite sides of the silicon contact structure 320 in the first direction D1**.

In some examples, both the silicon contact structure 320 and the first insulating layer 310 extend continuously in the first direction D1. The first trench 330 may be defined by a sidewall 331, the top surface 323 of the silicon contact structure 320 and a sidewall 332. For example, in a DRAM, the silicon contact structure 320 may be used to connect the drains or sources of a plurality of vertical transistors arranged in the first direction D1, so that the drains or sources of the transistors can be connected to the same bit line structure.

In some examples, the material of the first insulating layer 310 may include any suitable insulating material such as silicon oxide, silicon nitride, or silicon oxynitride. For example, the material of the first insulating layer 310 is silicon oxide.

In some examples, the silicon contact structure 320 may include a polysilicon layer 321 and a single crystal silicon layer 322. The top surface 323 of the polysilicon layer 321 may act as the bottom surface of the first trench 330. Exemplarily, the polysilicon layer 321 may be formed on the top side of the single crystal silicon layer 322 by any suitable thin film deposition process, such as physical vapor deposition (PVD), chemical vapor deposition (CVD) or atomic layer deposition (ALD), to ensure the preset depth of the first trench 330. In some specific examples, a polysilicon layer (not shown) can be fully filled on the top side of the single crystal silicon layer 322, such that the polysilicon layer has the surface level with the surface 311 of the first insulating layer 310. A portion of the polysilicon layer is then removed by an etching process (e.g., by controlling etching time) to form the polysilicon layer 321. By forming the silicon contact structure 320 including the polysilicon layer 321 and the single crystal silicon layer 322, it can be ensured that the difficulty of etching is lowered during the etching process used to form the first trench 330 having a preset depth and that a metal silicide layer 351 is generated based on the polysilicon layer 321, as shown in FIG. 3F.

At step S220, the first insulating layer is etched to expose, through the first trench, the opposite sidewalls of the first end of the silicon contact structure in the first direction.

Figure 3B:
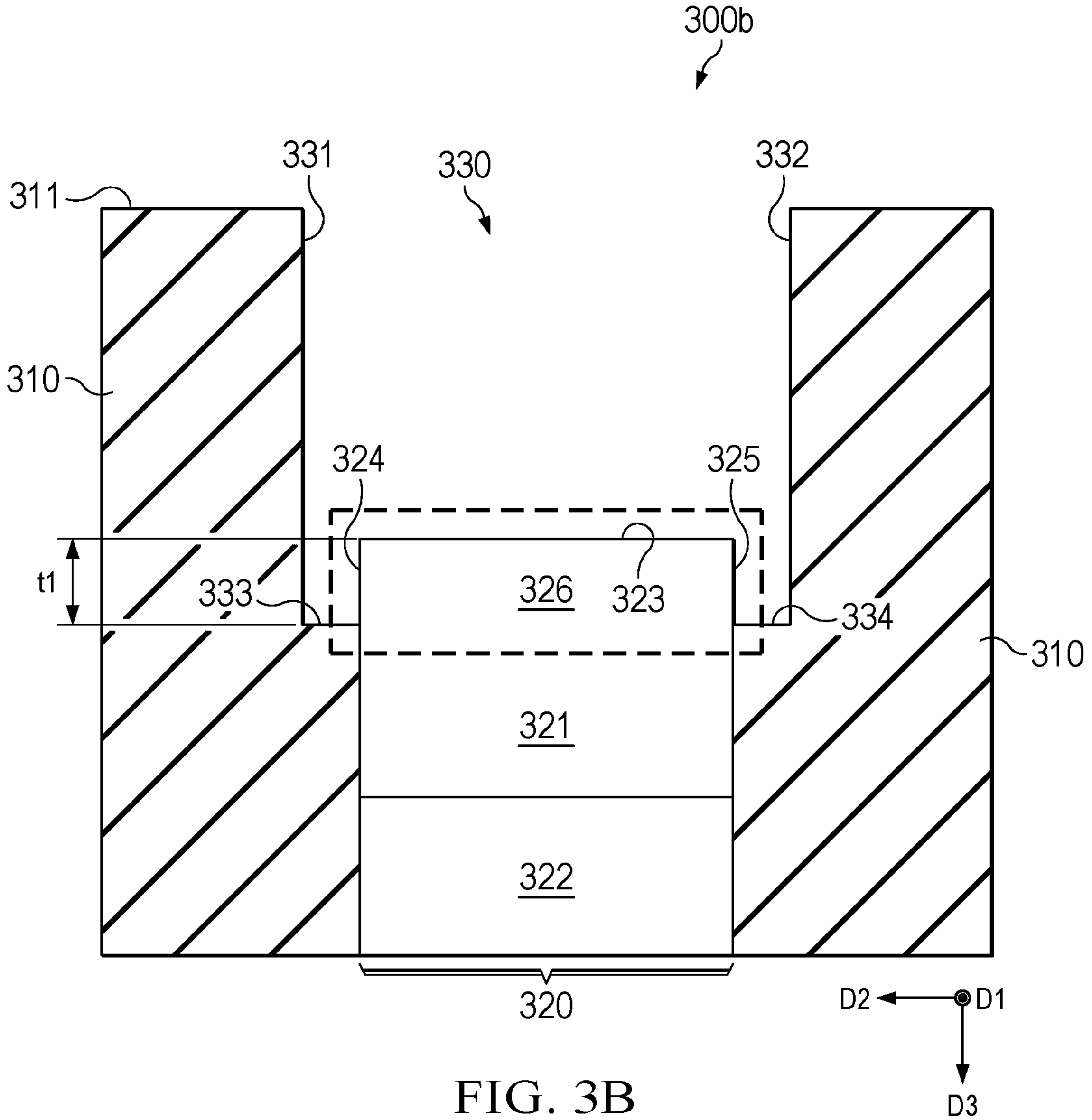

FIG. 3B shows an intermediate structure **300*b* of a semiconductor device obtained after performing step S220. As shown in FIGS. 3A and 3B, for example, a dry etching process may be used to etch the first insulating layer 310 so as to widen the dimension of the first trench 330 in the second direction D2 and deepen the dimension of the first trench 330 in the third direction D3, so that the opposite sidewalls 324 and 325 of the first end 326 of the silicon contact structure 320 in the first direction D1 are exposed through the enlarged first trench 330. The first trench 330 obtained after performing step S220 may be defined by a sidewall 331, a bottom surface 333, a sidewall 324 of the first end 326 of the silicon contact structure 320, the top surface 323 of the silicon contact structure 320, a sidewall 325 of the first end 326 of the silicon contact structure 320, a bottom surface 334 and a sidewall 332**.

In some examples, the distance t1 between the bottom surface 333 or 334 of the first trench 330 and the top surface 323 of the silicon contact structure 320 may be controlled by controlling etching time. For example, t1 may be 5 to 30 nm. Using t1 in the range from 5 to 30 nm may provide that the sidewall structure 340 to be formed subsequently (see FIG. 3I) can cover the opposite sides of the metal silicide layer 351 (see FIG. 3I) in the first direction D1.

At step S230, a sidewall structure is formed over the sidewalls of the first trench, wherein the sidewall structure covers the opposite sidewalls of the first end in the first direction.

Figure 3C:
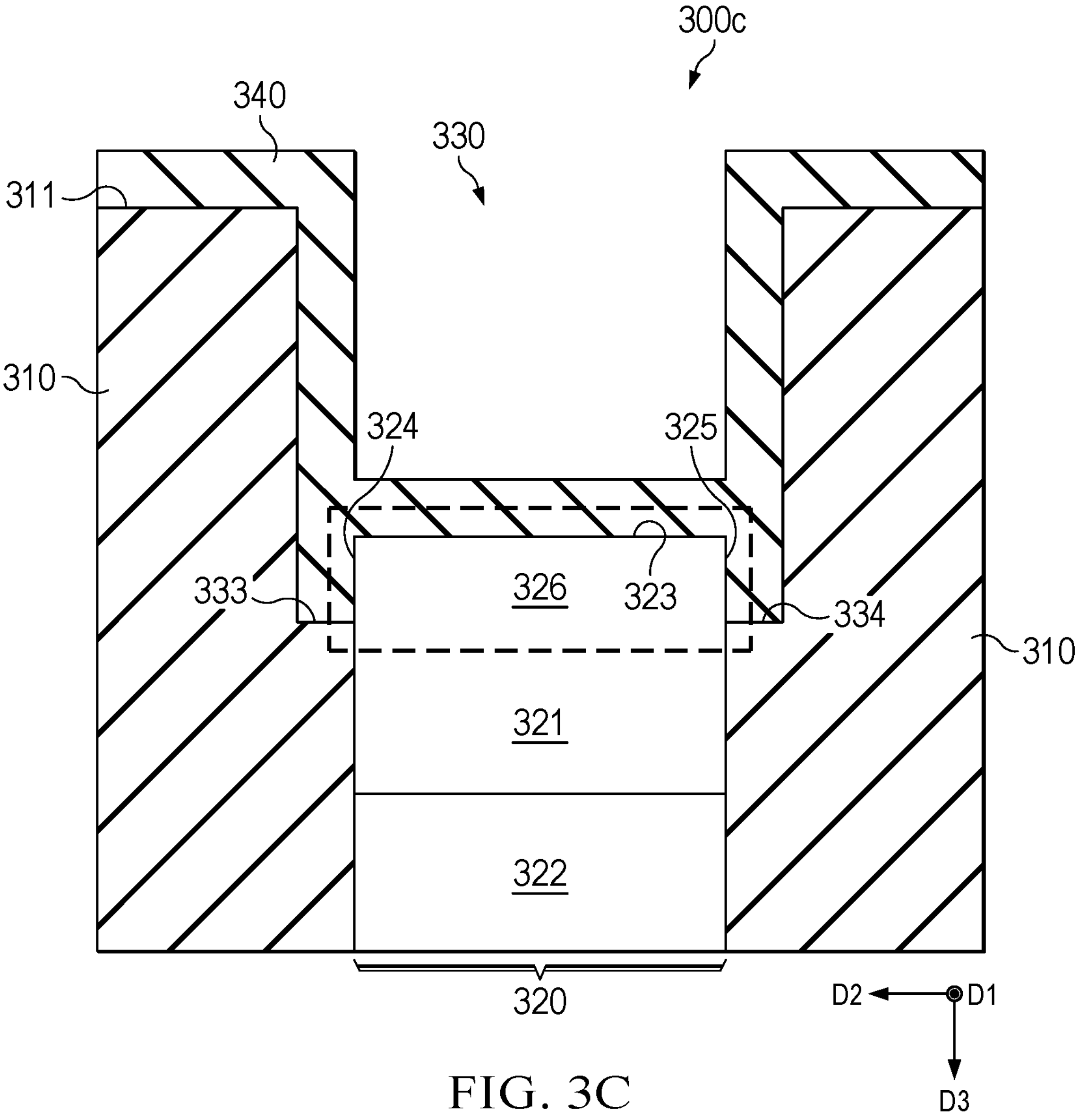
Figure 3D:
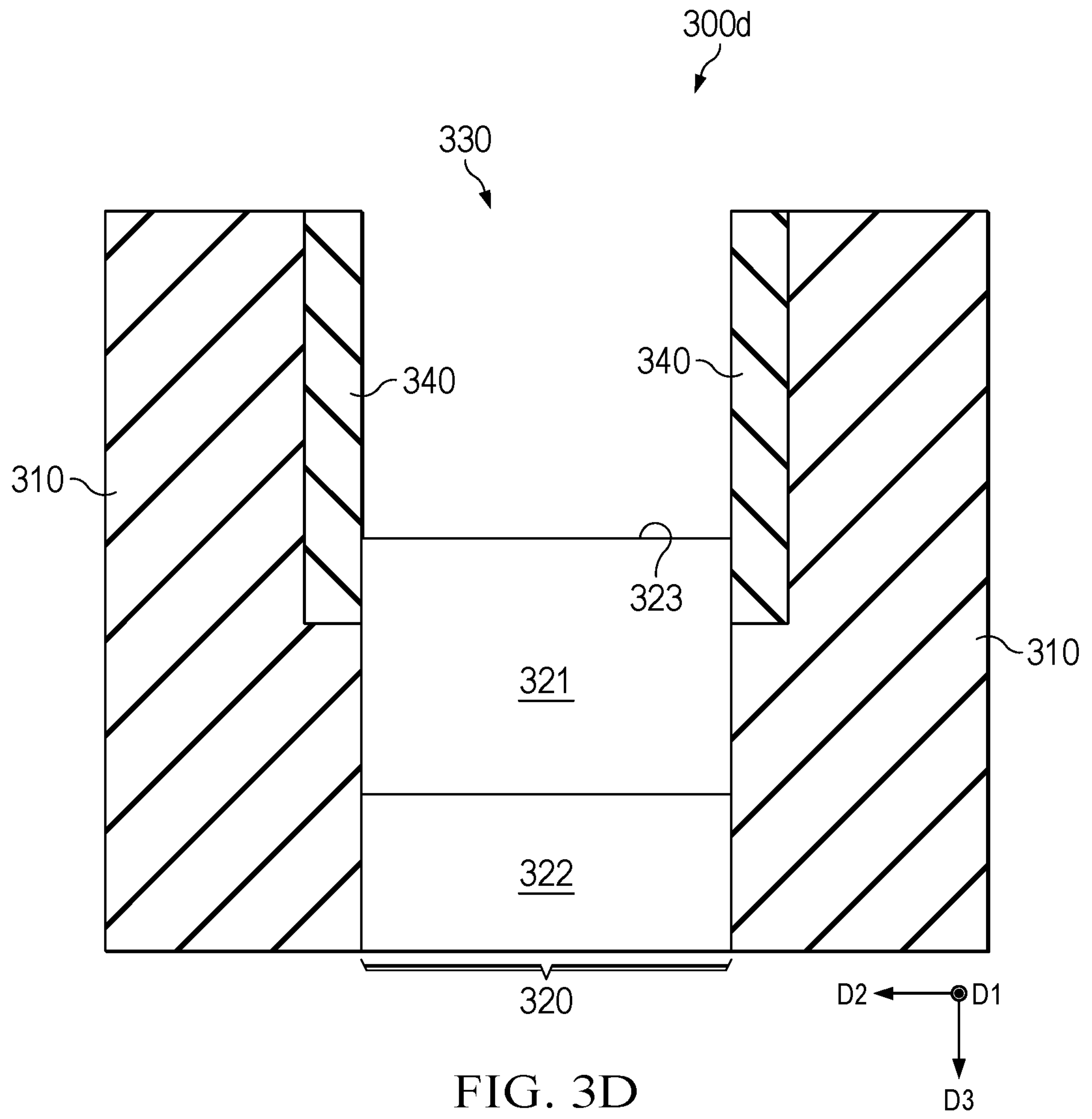
Figure 3E:
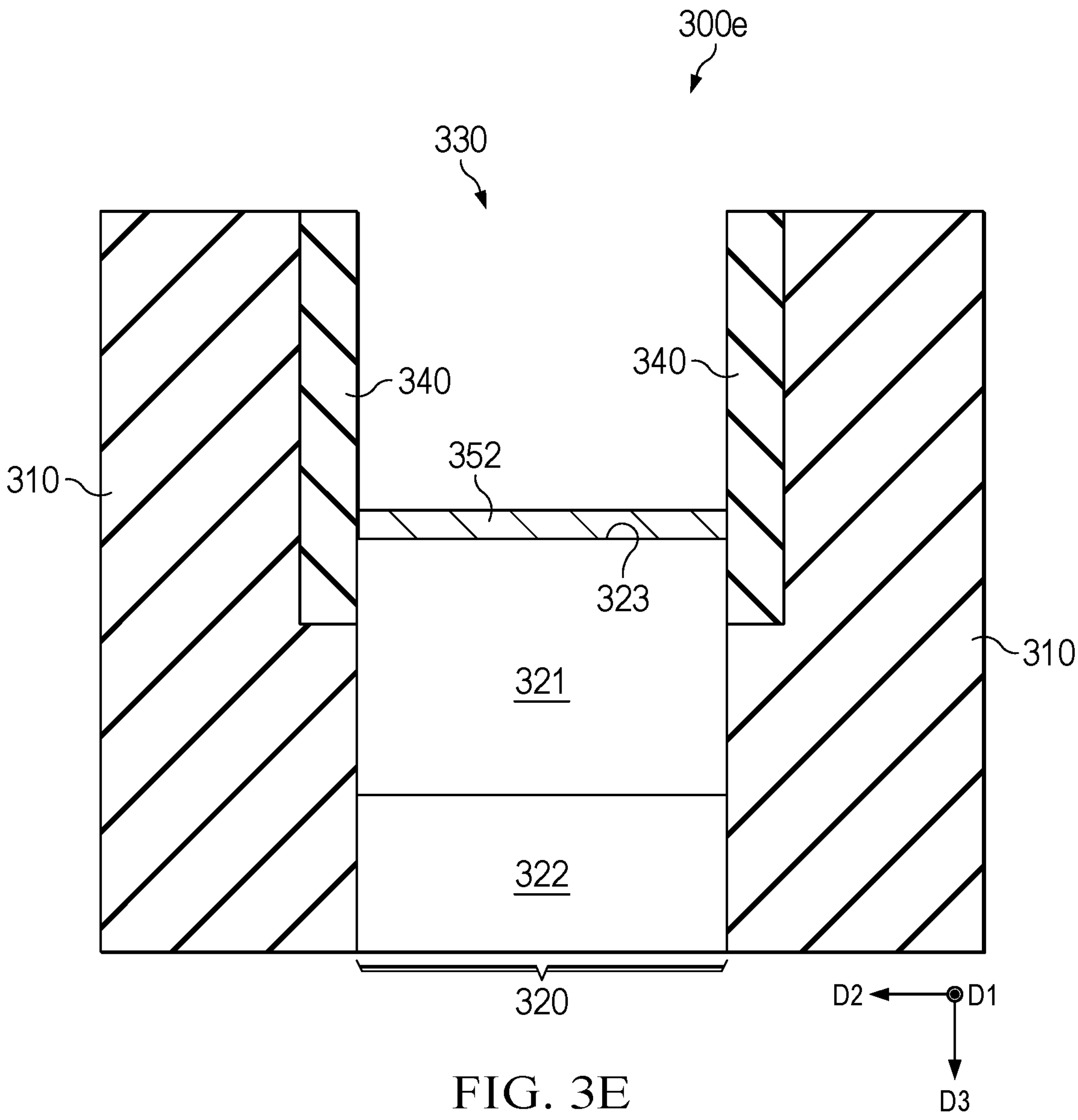
Figure 3F:
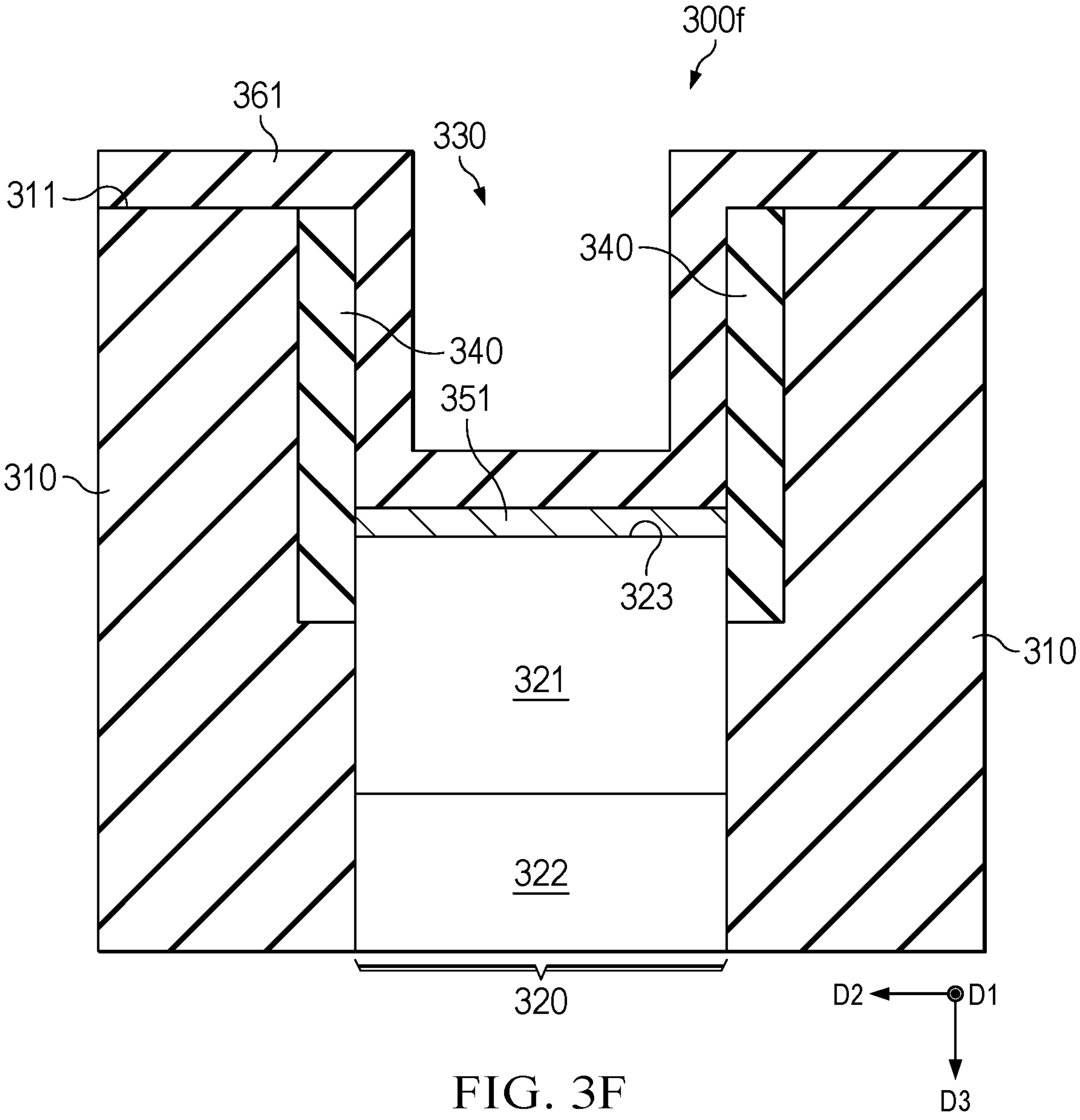

FIGS. 3C and 3D show intermediate structures 300*c* and 300*d* of a semiconductor device obtained in and after performing step S230, respectively. As shown in FIGS. 3B and 3C, a sidewall structure 340 may be formed over the surfaces of the sidewalls 331 and 332 of the first trench 330 using any suitable thin film deposition process such as PVD, CVD or ALD. For example, the sidewall structure 340 extends to cover the surface 311 of the first insulating layer 310 and the top surface 323 of the silicon contact structure 320. Because the opposite sidewalls 324 and 325 of the first end 326 of the silicon contact structure 320 in the first direction D1 are exposed through the first trench 330 formed at step S220, the sidewall structure 340 may extend to cover the surfaces of the sidewalls 324 and 325.

In some examples, as shown in FIGS. 3C and 3D, the portion of the sidewall structure 340 extending on the surface 311 of the first insulating layer 310 may be removed using, for example, an etching process or a chemical mechanical polishing (CMP) process. In some examples, the portion of the sidewall structure 340 extending on the top surface 323 of the silicon contact structure 320 may also be removed using an etching process, for example, dry etching or wet etching.

In some examples, the material of the sidewall structure 340 may have a different etching selection ratio from the material of the first insulating layer 310 with respect to the same etchant. For example, when the material of the first insulating layer 310 is silicon oxide, the material of the sidewall structure 340 may include titanium nitride. When the first insulating layer 310 and the sidewall structure 340 are fabricated using the above-mentioned materials respectively, the sidewall structure 340 may be used to block the metal materials in the bit line structure 360 (see FIG. 3I) to be formed subsequently from diffusing and also used to improve adhesion between a second insulating layer 370 and the metal materials in the bit line structure 360.

At step S240, a metal silicide layer is formed on the top side of the silicon contact structure and a bit line structure is formed in the space enclosed by the sidewall structure and the metal silicide layer.

Figure 3G:
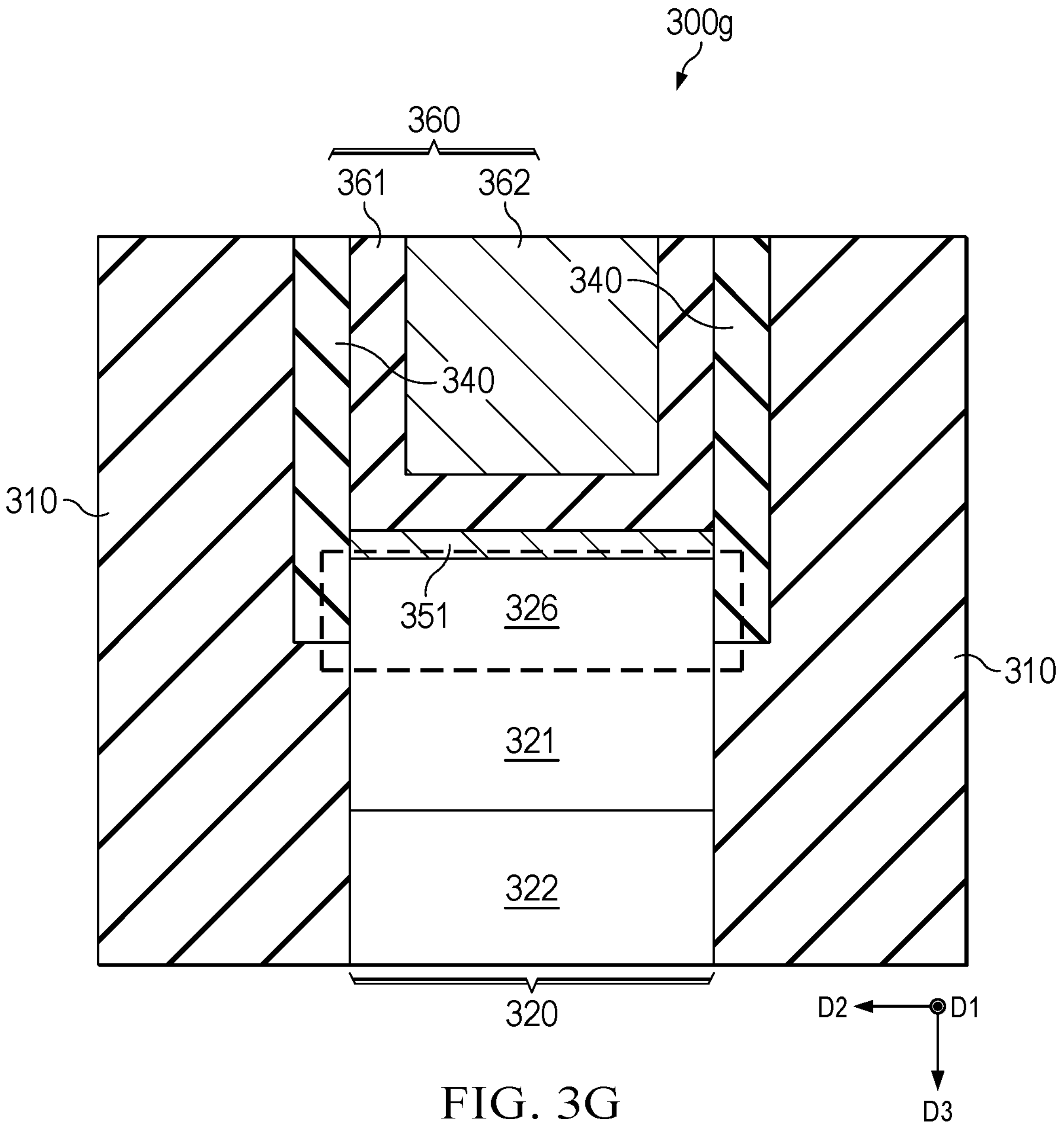

FIG. 3G shows an intermediate structure 300*g* of a semiconductor device obtained after performing step S240. As shown in FIGS. 3D and 3G, a metal silicide layer 351 may be formed on the top side of the silicon contact structure 320. Furthermore, the bit line structure 360 is formed in the space enclosed by the metal silicide layer 351 and the sidewall structure 340. Thereby, the sidewall structure 340 covers the opposite sides of the bit line structure 360 and the opposite sides of the metal silicide layer 351 in the first direction D1 and extends further to cover the opposite sides of the first end 326 of the silicon contact structure 320 in the first direction D1. The metal silicide layer 351 is formed between the silicon contact structure 320 and the bit line structure 360 and may be used to improve conductivity between the silicon contact structure 320 and the bit line structure 360.

In some examples, the metal silicide layer 351 and the bit line structure 360 may be formed by the steps to be described hereafter. FIGS. 3E and 3F show intermediate structures 300*c* and 300*f* during formation of the metal silicide layer and the bit line structure respectively.

As shown in FIGS. 3D and 3E, a metal layer 352 may be formed on the top surface 323 of the silicon contact structure 320 using any suitable thin film deposition process such as PVD. CVD or ALD. The material of the metal layer 352 may include, but is not limited to, titanium, cobalt, nickel, platinum or any combination thereof. For example, the material of the metal layer 352 is titanium.

As shown in FIGS. 3E and 3F, a blocking layer 361 may be formed over the surfaces of the sidewall structure 340 and the metal layer 352 using any suitable thin film deposition process such as PVD, CVD or ALD. In some examples, the blocking layer 361 also extends to cover the surface 311 of the first insulating layer 310. The material of the blocking layer 361 may include, but is not limited to, titanium, titanium nitride, tantalum, tantalum nitride or any combination thereof. For example, the material of the blocking layer 361 may be titanium nitride. When fabricated using any of the above-mentioned materials, the blocking layer 361 may be used to block the metal materials in the bit line structure 360 (see FIG. 3I) from diffusing and also used to improve adhesion between the second insulating layer 370 and the metal materials in the bit line structure 360.

In some examples, the metal layer 352 may react with the silicon contact structure 320 by an annealing process to generate the metal silicide layer 351. In some specific examples, when the material of the metal layer 352 is titanium, the titanium may react with the polysilicon by the first rapid thermal annealing (RTA-1) process to generate metal silicide Ti2Si of high resistance. Then, the metal silicide Ti2Si of high resistance is converted into metal silicide TiSi2 of low resistance by the second rapid thermal annealing (RTA-2) process. The temperature of RTA-2 is higher than that of RTA-1RTA-2. During generation of the metal silicide layer 351, the blocking layer 361 covering the metal layer 352 may prevent the metal layer 352 from flowing in the rapid thermal annealing process.

In some examples, as shown in FIGS. 3F and 3G, a metal material is filled inside the blocking layer 361 to form a metal material layer 362 using any suitable thin film deposition process such as PVD, CVD or ALD. The blocking layer 361 and the metal material layer 362 may constitute the bit line structure 360. The bit line structure 360 may extend continuously in the first direction D1. In some examples, the metal material may include, but not limited to, tungsten, cobalt, copper, aluminum, molybdenum or any combination thereof. For example, the metal material may be tungsten. In some examples, the portion of the blocking layer 361 extending on the surface 311 of the first insulating layer 310 may be removed using a CMP process to planarize the surface of the first insulating layer 310 and the bit line structure 360.

In some examples, with reference to FIG. 3E, after the metal layer 352 is formed on the top surface 323 of the silicon contact structure 320, the metal layer 352 may react the silicon contact structure 320 by the annealing process directly to generate a metal silicide layer and subsequently a bit line structure (not shown) constituted by a metal material layer is formed in the space enclosed by the sidewall structure and the metal silicide layer.

Figure 3H:
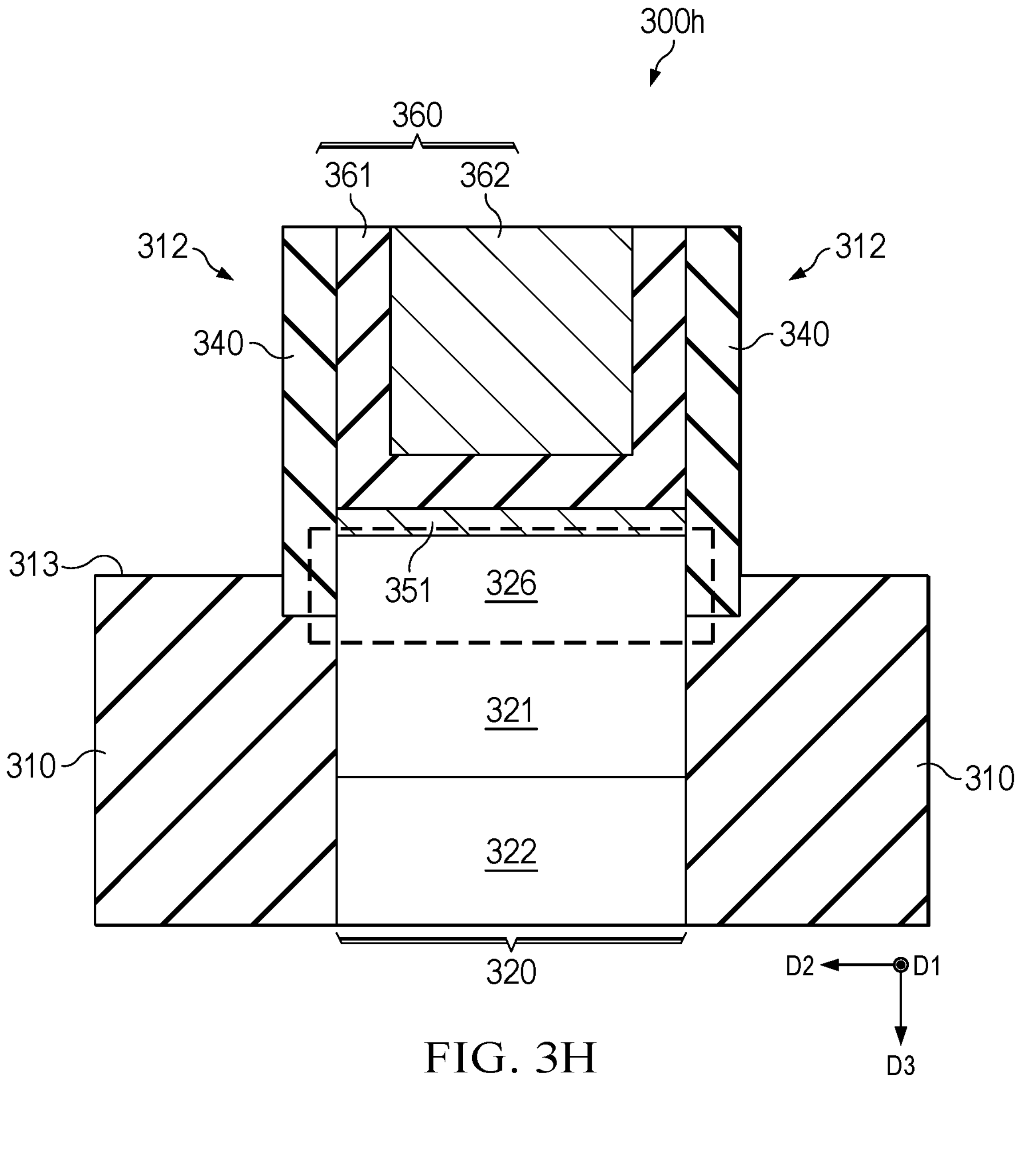
Figure 3I:
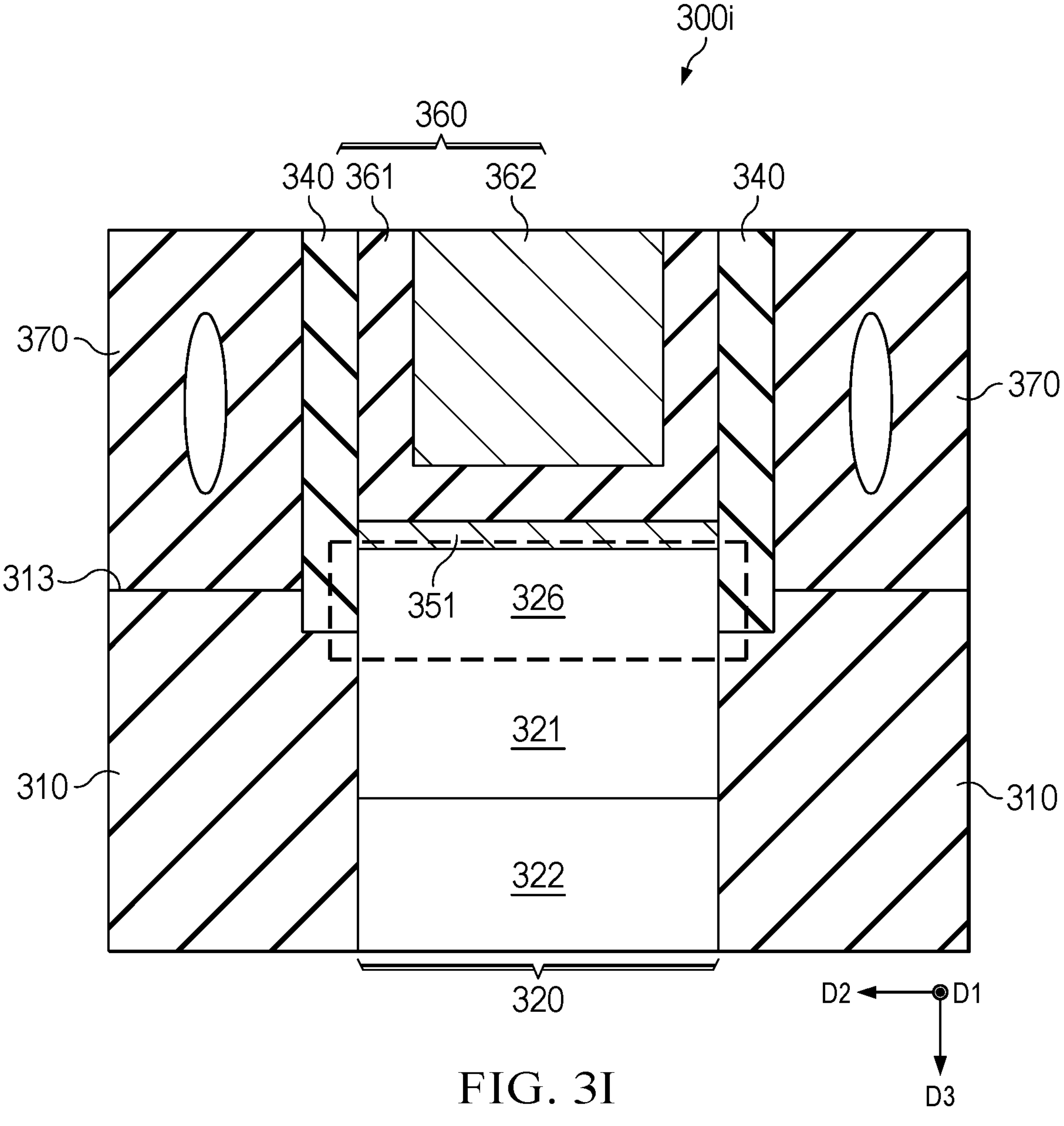
FIG. 3I is a schematic diagram of a semiconductor device in an example of the present application.

In some examples, after performing step S240, the fabrication method 200 may further include the steps to be described hereafter. FIG. 3H shows an intermediate structure 300*h* of a semiconductor device obtained after removing the first insulating layer partially. FIG. 3I shows a semiconductor device 300*i* obtained after forming a second insulating layer.

As shown in FIGS. 3G and 3H, the portion of the first insulating layer 310 corresponding to the bit line structure 360 may be removed using an etching process (e.g., a dry etching or a wet etching) to form a first recess 312. In some examples, the bottom surface 313 of the first recess 312 may be approximately below the bottom surface of the bit line structure 360, for example, below the bottom surface of the metal silicide layer 351. Since the sidewall structure 340 covers the opposite sidewalls of the first end 326 of the silicon contact structure 320 in the first direction D1 and extends further to cover the opposite sidewalls of the metal silicide layer 351 in the first direction D1, during the process of removing the portion of the first insulating layer 310, the sidewall structure 340 may block the etchant (e.g., acid solution) from entering between the metal silicide layer 351 and the silicon contact structure 320 and avoid the corrosion of the oxides (e.g., titanium oxide) that may exist between the metal silicide layer 351 and the silicon contact structure 320, so that challenges of collapse of the bit line structure 360 may be improved, the product integrity may be increased and the product yield may be improved.

As shown in FIG. 3I, after the first recess 312 is formed, the second insulating layer 370 may be formed in the first recess 312 using any suitable thin film deposition process such as PVD, CVD or ALD. For example, the second insulating layer 370 may be formed to have air gaps therein by controlling the thin film deposition process. In some examples, the second insulating layer 370 may include silicon oxide, silicon nitride, silicon oxynitride or any other suitable insulating material. For example, the material of the second insulating layer 370 may be silicon oxide.

In a DRAM, a plurality of bit line structures 360 may be arranged in the second direction D2 (not shown) and the second insulating layer 370 may be provided between adjacent bit line structures 360. By forming the second insulating layer 370 having air gaps therein, insulating performance can be improved and interference between adjacent bit line structures may be avoided.

In accordance with the method of fabricating a semiconductor device provided in the above-described example, the opposite sidewalls of the first end of the silicon contact structure in the first direction are exposed through the first trench by etching the first insulating layer. A sidewall structure is formed over the sidewalls of the first trench, and a metal silicide layer and a bit line structure are formed on the top side of the silicon contact structure, so that the sidewall structure may cover the opposite sides of the bit line structure and the opposite sides of metal silicide layer in the first direction and extends further to cover the opposite sides, in the first direction, of the first end of the silicon contact structure proximate to the metal silicide layer. Therefore, in the step of removing the portion of the first insulating layer corresponding to the bit line structure, the sidewall structure will block the etchant from entering between the metal silicide layer and the silicon contact structure and avoid the corrosion of the oxides that may exist between the metal silicide layer and the silicon contact structure, so that challenges of collapse of the bit line structure will be effectively improved, product integrity can be increased and product yield can be improved.

Some examples of the present application further provide a semiconductor device. For example, the semiconductor device may be formed by the fabrication method 200. As shown in FIG. 3I, the semiconductor device **300*i* includes the silicon contact structure 320, the metal silicide layer 351, the bit line structure 360 and the sidewall structure 340. The metal silicide layer 351 is on one side of the silicon contact structure 320. The bit line structure 360 is on the side of the metal silicide layer 351 away from the silicon contact structure 320 and extends in the first direction D1. The sidewall structure 340 covers the opposite sides of the bit line structure 360 and the opposite sides of the metal silicide layer 351 in the first direction D1 and extends further to cover the opposite sides, in the first direction D1, of the first end 326 of the silicon contact structure 320 proximate to the metal silicide layer 351**.

In some examples, the silicon contact structure 320 may extend continuously in the first direction D1. For example, in a DRAM, the silicon contact structure 320 may be used to connect the drains or sources of a plurality of vertical transistors arranged in the first direction D1, so that the drains or sources of the transistors can be connected to the same bit line structure.

In some examples, the silicon contact structure 320 may include the polysilicon layer 321 and the single crystal silicon layer 322 with the polysilicon layer 321 located between the single crystal silicon layer 321 and the metal silicide layer 351. The silicon contact structure 320 includes the polysilicon layer 321 and the single crystal silicon layer 322 to ensure the dimension of the bit line structure 360 in the third direction D3 and to reduce the difficulty of fabricating the silicon contact structure 320.

In some examples, the sidewall structure 340 may extend continuously in first direction D1. The sidewall structure 340 may be in contact with the opposite sides of the metal silicide layer 351 in the first direction D1 and with the opposite sides of the first end 326 in the first direction D1, so that the sidewall structure 340 are attached to the first end 326 and the metal silicide layer 351 closely.

In some examples, the semiconductor device **300*i* may further include an oxide layer (not shown) between the metal silicide layer 351 and the silicon contact structure 320, and the sidewall structure 340 also covers the opposite sides of the oxide layer in the first direction D1. The oxide layer is generated during the process of forming the metal silicide layer 351** and may be a film extending continuously or discontinuously.

In some examples, the semiconductor device **300*i* may further include the insulating layers 310 and 370. The insulating layers 310 and 370 are on the opposite sides of the sidewall structure 340 and the opposite sides of the silicon contact structure 320 in the first direction D1. For example, the insulating layers 310 and 370 may have the same material, for example, silicon oxide, so that there is no obvious interface between the insulating layers 310 and 370. For example, in a DRAM a plurality of bit line structures 360 may be arranged in the second direction D2 (not shown) and the insulating layer 370 may be provided between adjacent bit line structures 360. In some examples, the portion of the insulating layers 310340 and 370 corresponding to the bit line structure 360 (e.g., the insulating layer 370) may have air gaps therein. The insulating layer 370 having air gaps therein may improve insulating performance and prevent interference between adjacent bit line structures 360**.

In some examples, the material of the sidewall structure 340 may have a different etching selection ratio from the material of the portion of the insulating layers 310 and 370 corresponding to the silicon contact structure 320 (e.g., the first insulating layer 310) with respect to the same etchant.

For example, when the material of the insulating layer 310 is silicon oxide, the material of the sidewall structure 340 may include titanium nitride. The sidewall structure 340 having the material of titanium nitride may be used to block the metal materials in the bit line structure 360 from diffusing and also used to improve adhesion between the insulating layer 370 and the metal material in the bit line structure 360.

In some examples, the bit line structure 360 may include the metal material layer 362 and the blocking layer 361. The blocking layer 361 covers the metal material layer 362 on opposite sides in the first direction D1 and is between the metal material layer 362 and the metal silicide layer 351. In some examples, the material of the metal material layer 362 includes at least one of tungsten, aluminum and copper, and the material of the blocking layer 361 includes at least one of titanium, titanium nitride, tantalum and tantalum nitride. For example, the material of the metal material layer 362 is tungsten and the material of the blocking layer 361 is titanium nitride. When having the same material (e.g., titanium nitride), the sidewall structure 340 and the blocking layer 361 may be an integral structure and have no obvious interface therebetween.

The blocking layer 361 may also be omitted in the bit line structure 360 and the present application is not limited in this respect.

In some examples, the material of the metal silicide layer 351 includes at least one of titanium silicide, cobalt silicide, nickel silicide and platinum silicide. For example, the material of the metal silicide layer 351 may be titanium silicide (e.g., TiSi2).

In the semiconductor device provided in accordance with the above-described example, because the sidewall structure covers the opposite sides of the bit line structure and the opposite sides of the metal silicide layer in the first direction, and extends further to cover the opposite sides, in the first direction, of the first end of the silicon contact structure proximate to the metal silicide layer, the sidewall structure will block the etchant from entering between the metal silicide layer and silicon contact structure and avoid the corrosion of the oxides that may exist between the metal silicide layer and silicon contact structure, so that challenges of collapse of the bit line structure will be effectively improved, product integrity can be ensured and product yield can be improved.

Some examples of the present application further provide a memory system. The memory system includes the semiconductor device in any of the above-described examples (e.g., the semiconductor device 300*i*) and a controller.

Figure 4:
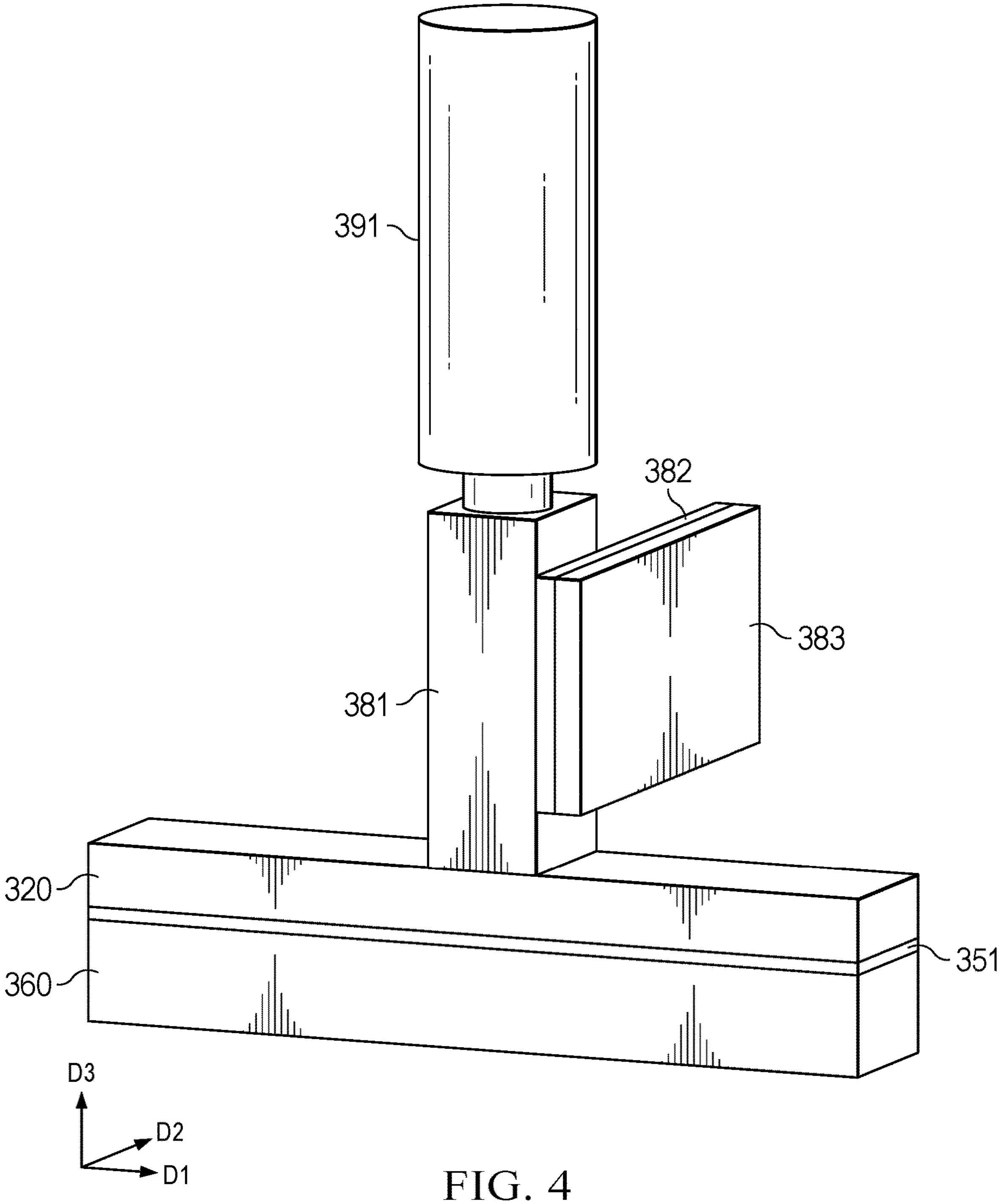
FIG. 4 is a schematic diagram of a memory cell in an example of the present application.

In some examples, the semiconductor device 300*i* may be a part of a DRAM. FIG. 4 is a schematic diagram of a memory cell in an example of the present application. In some examples, as shown in FIG. 4, the semiconductor device 300*i* may further include a semiconductor pillar 381 and a gate insulating layer 382 and a gate 383 located on the sidewall of the semiconductor pillar 381, so that a transistor is formed. Voltages are applied via the gate 383 to control the transistor to be On. One end of the semiconductor pillar 381 may be coupled with a capacitive structure 391. For example, one dynamic random memory cell is constituted by one transistor and one capacitive structure.

As shown in FIGS. 3I and 4, the other end of the semiconductor pillar 381 may be connected to the silicon contact structure 320. A plurality of memory cells may be arranged in the first direction D1 and the second direction D2 to constitute a memory cell array. The other end of the semiconductor pillars 381 in a plurality of transistors arranged in the first direction D1 are connected to the bit line structure 360. The metal silicide layer 351 is on one side of the silicon contact structure 320. The bit line structure 360 is on the side of the metal silicide layer 351 away from the silicon contact structure 320 and extends in the first direction D1. The sidewall structure 340 covers the opposite sides of the bit line structure 360 and the opposite sides of the metal silicide layer 351 in the first direction D1 and extends further to cover the opposite sides, in the first direction D1, of the first end 326 of the silicon contact structure 320 proximate to the metal silicide layer 351.

The controller may be used to control individual memory cells in the memory cell array to enable storage and reading of data.

In some examples, the memory system may be used as an internal memory or a cache of an electronic device. In some other examples, the memory system may be used for assistance in a solid-state drive to improve performance of the solid-state drive-in writing/reading or other aspects. For example, embedded dynamic random memories may be chosen for high-end solid-state drive products to improve their product performance and speed of random reading/writing. For example, when a file, especially a small one, is being written, it is processed through the DRAM and then stored in a Flash to enable the solid-state drive to have higher efficiency of storage and a higher speed.

The description above is only for the purpose of explaining examples of the present application and the technical principles used. The scope claimed by the present application is not limited to technical solutions composed of particular combinations of the above-mentioned technical features, and instead will cover other technical solutions composed of any combinations of the above-mentioned features and their equivalents without departing from the technical concept, for example, the technical solutions resulted from substitutions of the above-mentioned features by technical features of similar functions (including, but not limited to) disclosed in the present application.

What is claimed is:

1. A semiconductor device, comprising:

a silicon contact structure;

a metal silicide layer on one side of the silicon contact structure;

a bit line structure located on the side of the metal silicide layer away from the silicon contact structure and extending in a first direction; and a sidewall structure covering the opposite sides of the bit line structure and the opposite sides of the metal silicide layer in the first direction and extending further to cover the opposite sides, in the first direction, of a first end of the silicon contact structure proximate to the metal silicide layer.

2. The semiconductor device of claim 1, wherein the sidewall structure extends continuously in the first direction.

3. The semiconductor device of claim 1, wherein the sidewall structure is in contact with the opposite sides of the metal silicide layer in the first direction and with the opposite sides of the first end in the first direction.

4. The semiconductor device of claim 1, further comprising an oxide layer between the metal silicide layer and the silicon contact structure, wherein the sidewall structure also covers the opposite sides of the oxide layer in the first direction.

5. The semiconductor device of claim 1, wherein the semiconductor device further comprises an insulating layer on the opposite sides of the sidewall structure and the opposite sides of the silicon contact structure in the first direction.

6. The semiconductor device of claim 5, wherein a portion of the insulating layer corresponding to the bit line structure has air gaps therein.

7. The semiconductor device of claim 5, wherein a material of the sidewall structure has a different etching selection ratio from the material of a portion of the insulating layer corresponding to the silicon contact structure.

8. The semiconductor device of claim 7, wherein the material of the sidewall structure comprises titanium nitride.

9. The semiconductor device of claim 1, wherein the bit line structure comprises a metal material layer and a blocking layer with the blocking layer covering the metal material layer on opposite sides in the first direction and located between the metal material layer and the metal silicide layer.

10. The semiconductor device of claim 9, wherein the sidewall structure and the blocking layer have the same material and are an integral structure.

11. The semiconductor device of claim 9, wherein the material of the metal material layer comprises at least one of tungsten, aluminum and copper, and the material of the blocking layer comprises at least one of titanium, titanium nitride, tantalum and tantalum nitride.

12. The semiconductor device of claim 1, wherein a material of the metal silicide layer comprises at least one of titanium silicide, cobalt silicide, nickel silicide and platinum silicide.

13. The semiconductor device of claim 1, wherein the silicon contact structure comprises a polysilicon layer and a single crystal silicon layer with the polysilicon layer located between the single crystal silicon layer and the metal silicide layer.

14. A memory system, comprising:
- a semiconductor device, comprising:
  - a silicon contact structure;
  - a metal silicide layer on one side of the silicon contact structure;
  - a bit line structure located on a side of the metal silicide layer away from the silicon contact structure and extending in a first direction; and
  - a sidewall structure covering the opposite sides of the bit line structure and the opposite sides of the metal silicide layer in the first direction and extending further to cover the opposite sides, in the first direction, of a first end of the silicon contact structure proximate to the metal silicide layer; and
- a controller coupled with and used to control the semiconductor device.

15. The semiconductor device of claim 1, wherein the sidewall structure covers less than all of the silicon contact structure in the first direction beginning at the first end and extending away from the silicon contact structure.

16. The semiconductor device of claim 13, wherein sidewall structure covers a portion of a side of the metal silicide layer of the silicon contact structure without covering portions of the side of the polysilicon layer or the single crystal silicon layer.

17. The semiconductor device of claim 1, wherein the sidewall structure is in contact with the opposite sides of the bit line structure, the opposite sides of the metal silicide layer, and the opposite sides of the first end of the silicon contact structure.

18. The semiconductor device of claim 1, wherein the sidewall structure extends in the first direction into an insulating layer that is in contact with the silicon contact structure.

* * * * *